(12) United States Patent
Heid

(10) Patent No.: US 6,434,414 B1
(45) Date of Patent: Aug. 13, 2002

(54) METHOD AND DEVICE FOR SUPPRESSING STIMULATIONS IN A SUBJECT UNDERGOING A MAGNETIC RESONANCE SCAN

(75) Inventor: Oliver Heid, Gunzenhausen (DE)

(73) Assignee: Siemens Aktiengesellschaft, Munich (DE)

( * ) Notice: Subject to any disclaimer, the term of this patent is extended or adjusted under 35 U.S.C. 154(b) by 53 days.

(21) Appl. No.: 09/609,486

(22) Filed: Jul. 5, 2000

(30) Foreign Application Priority Data

Jul. 5, 1999 (DE) .......................... 199 30 879

(51) Int. Cl.$^7$ .............................................. A61B 5/055
(52) U.S. Cl. ...................... 600/410; 324/307; 600/407; 600/382; 600/393
(58) Field of Search ................................ 600/410, 411, 600/407, 413, 382, 393; 324/307, 309

(56) References Cited

U.S. PATENT DOCUMENTS

| | | | | |
|---|---|---|---|---|
| 5,209,233 A | * | 5/1993 | Holland et al. | 128/901 |
| 5,497,773 A | * | 3/1996 | Kuhara et al. | 324/318 |
| 5,722,409 A | * | 3/1998 | Kuhara et al. | 324/306 |
| 5,846,198 A | * | 12/1998 | Killmann | 600/382 |
| 5,904,712 A | * | 5/1999 | Axelgaard | 600/391 |
| 6,038,485 A | * | 3/2000 | Axelgaard | 600/391 |
| 6,198,282 B1 | * | 3/2001 | Dumoulin | 324/307 |

* cited by examiner

Primary Examiner—Ruth S. Smith
Assistant Examiner—Runa Shah Qaderi
(74) Attorney, Agent, or Firm—Schiff Hardin & Waite

(57) ABSTRACT

In a method and a device for suppressing stimulations in a living examination subject as a result of switched gradients during data scans for producing magnetic resonance images, at least two electrodes, which are connected to one another by at least one electrically conductive connection, are attached to the skin of the examination subject for bridging at least one region of the examination subject that is of lower electrical conductivity than the regions surrounding it.

13 Claims, 2 Drawing Sheets

METHOD AND DEVICE FOR SUPPRESSING STIMULATIONS IN A SUBJECT UNDERGOING A MAGNETIC RESONANCE SCAN

BACKGROUND OF THE INVENTION

1. Field of the Invention

The present invention is directed to a method for suppressing stimulations in a living examination subject as a result of switched gradient fields during magnetic resonance tomography scans of areas of the examination subject that lie within the imaging volume of the magnetic resonance tomography device.

2. Description of the Prior Art

Magnetic resonance tomography is a known technique for acquiring data from the interior of the body of a living patient. Rapidly switched gradient fields of high amplitude are superimposed on a static basic magnetic field of high amplitude to obtain such data.

In a magnetic resonance image scan (data acquisition procedure) stimulations can be initiated in living examination subjects due to the switching of the gradient fields. The gradient fields affecting the examination subject are characterized by a magnetic flux density, which changes in terms of time. The time-changing magnetic field generates eddy currents or induction currents in the examination subject. Their nature is mainly dependent on the shape and size of microscopic structures in the body. Due to their mutual electromagnetic interaction, these currents influence physiological currents, such as potentials at cells. All cells have an equilibrium rest potential. At the equilibrium rest potential, all membrane currents of a cell are in equilibrium. When the membrane potential is depolarized by means of an additional membrane current, which, for example, reaches the cell from an outside influence, this is associated with a change of the potential, known as an action potential. The initiation potential for an action potential is named the threshold. The equilibrium of the membrane currents changes at the threshold. Additional membrane currents, which depolarize the membrane, occur for a short period of time. An action is associated with an action potential. For example, every twitching of a muscle fiber is accompanied with an action potential in the muscle fiber, and each reaction of a sense cell to a sense stimulus is forwarded by means of action potentials. For a detailed description of neurophysiological processes, see the book of R. F Schmidt (publisher) "Neuround Sinnesphysiologie", Springer $2^{nd}$ corrected edition 1995, chapters 2 and 3.

The intensity of the electrical currents generated by the switched gradient fields, among other things, depends on the cross-sectional surface which is permeated by the gradient field and depends on the time change of the gradient field. The aforementioned currents traverse regions of the examination object with a comparatively high electrical conductivity as well as regions of low electrical conductivity. Depending on whether areas with high or low electrical conductivity are concerned, the above cited current effects a correspondingly large or small electrical voltage in these regions. When the voltage exceeds a specific threshold, this leads to the initiation of action potentials and the examination subject is stimulated.

In order to avoid such stimulations in the examined body with respect to rapidly switched gradient fields, it is known from German OS 42 25 592 to cover stimulation-sensitive areas outside of the imaging volume with a closed conductor loop. This leads to a reduction of the currents induced in the covered area. This method is based on the knowledge that the highest current values are induced outside of the imaging volume with respect to switched gradient fields, so that the danger of stimulations is greatest there. As a result of attaching conductor loops outside of the imaging volume, however, the linearity of the gradients, which is important for the image quality, is somewhat degraded and the position of the conductor loops normally must be adapted as well with respect to only changes of the imaging area.

Further, a series of methods is known that make it possible to predict or calculate stimulations in an examination subject undergoing magnetic resonance tomography. A detailed description can be found in German OS 199 13 547, for example. For example, stimulations can be avoided in by suitably controlling the curves of the gradient fields, however, this may mean that the best efficiency of the gradient system is not fully utilized.

SUMMARY OF THE INVENTION

An object of the present invention is to provide a method and a device for implementing the method, for suppressing stimulations of an examination subject, so that above cited disadvantages are avoided or at least reduced.

The object is inventively achieved in a method and device wherein at least two electrodes, which are connected to one another by at least one electrically conductive connection, are attached to the skin of the examination subject for bridging at least one area of the examination subject, which exhibits a lower electrical conductivity than the areas surrounding it.

A parallel current path is thereby created for the currents in areas of low electrical conductivity of a patient, which currents are generated by the gradient fields, so that the currents and therefore also the arising electrical voltages, are reduced in these areas, so that stimulations are prevented.

In an embodiment, the area of low electrical conductivity is situated outside of the imaging volume. The area in which the danger of stimulation is greatest is protected as a result.

In another embodiment, the transition resistance between the electrode and the skin is made close to zero, for example by applying an electrically conductive fluid or gel between the electrode and the skin. Injuries of the patient at the transition location of the current from the skin to the electrode as a result of an undesired, large voltage drop at the transition location are thereby prevented.

In a further embodiment, the electrically conductive connection between the electrodes exhibits an electrical conductivity on the order of magnitude of electrically highly conductive areas of the examination subject, for example in the range of 0.2 S/m through 4 S/m. This prevents a parallel current path of such low impedance from being created opposite the cited area. Such a current path would initiate current densities at the current transition locations between skin and electrodes, and these densities would lead to injuries of the patient.

In another embodiment, the device for implementing the method is flexibly changeable in shape, so that an adaptation to differently shaped areas of the examination subject is possible. For this purpose, the device is fashioned as a pillow or cushion in a preferred embodiment. The pillow contains the electrode areas, which can be accessed at the pillow surface, and contains the electrically conductive connection between the electrode areas. For this purpose, the pillow contains, for example, an electrically conductive pillow case and an electrically conductive pillow filling, for example a saline solution, or it contains a gel-like mass.

DESCRIPTION OF THE PREFERRED EMBODIMENTS

Figure 1:
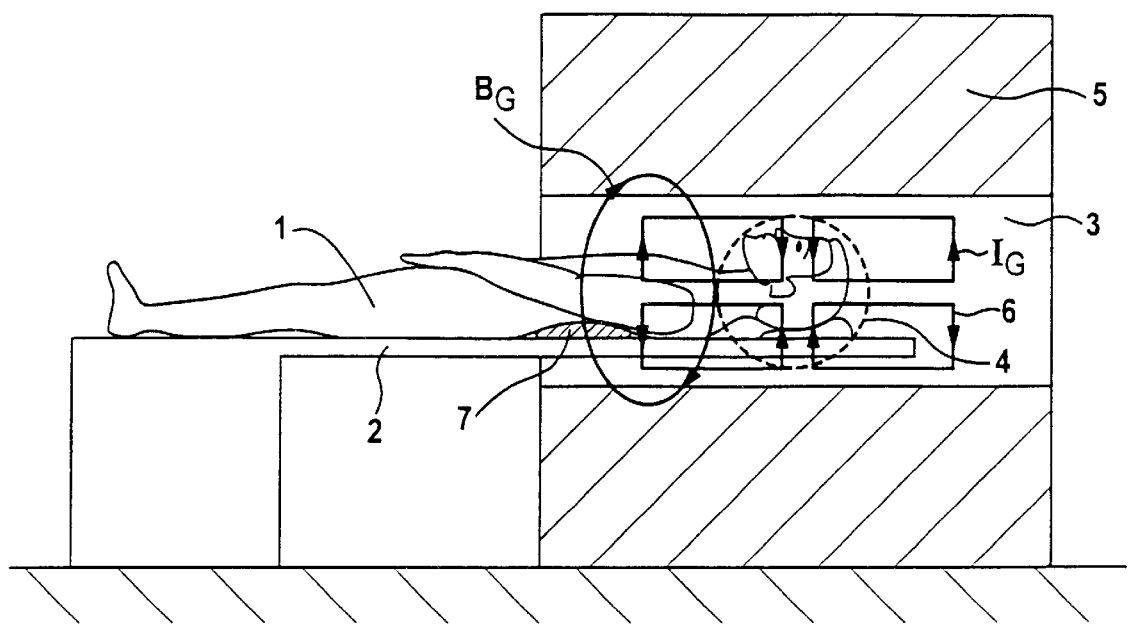
FIG. 1 illustrates an exemplary embodiment of the invention, in the context of a magnetic resonance tomography apparatus.

FIG. 1 shows, as an exemplary embodiment of the invention with respect to magnetic resonance tomography, a patient lying on a patient bed 2 in a tubular opening 3 of a magnetic resonance tomography device. For example, magnetic resonance images of the head of the patients are to be obtained. Therefore, the head of the patient is positioned in the imaging volume 4 of the device. The static basic magnetic field is generated by a basic field magnet 5. The switched, and therefore time-varying, gradient fields are generated by coils of the gradient system. Only the gradient coil 6 for one spatial direction is shown as an example. This gradient coil 6 is composed of four individual coils that are symmetrically attached to a gradient tube as saddle shaped coils. Due to the fashioning of the gradient coils, the gradient coil current $I_G$ also generates a magnetic field outside of the imaging volume (the lines of electric flux of the magnetic field are referred to as $B_G$) The above cited magnetic field is especially critical regarding stimulation, since, due to the local gradient field intensity, the time change of the magnetic field is the largest outside of the imaging volume and because its lines of electric flux frontally penetrate the patient (in the shown example) in the abdomen, so that a large magnetic flux is generated. For purposes of suppressing stimulations, a pillow 7, which is subsequently explained in greater detail, is situated between patient and patient bed 2 in the region of the kidney area of the patient. The pillow 7 has intermediate contact with the skin of the patient. An electrically conductive gel is applied between the skin and the pillow case of the pillow 7, so that the transition resistance between skin and pillow case is as close to zero as possible.

Figure 2:
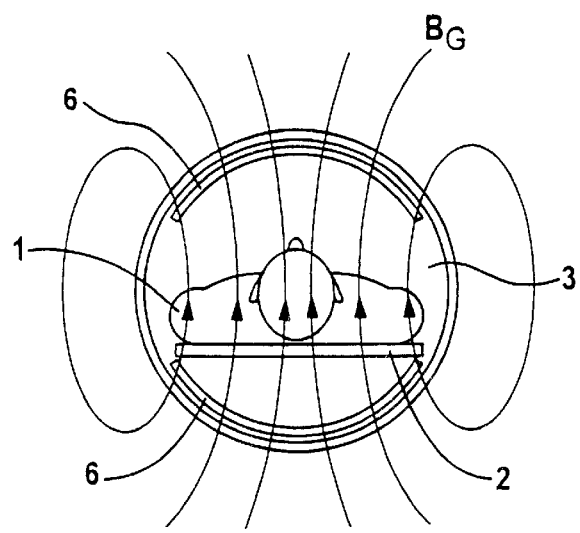
FIG. 2 is a transverse section through a region from FIG. 1.

FIG. 2 shows a transverse section through the kidney region of the patient from FIG. 1, whereby it can be seen that the patient is perpendicularly penetrated by the magnetic lines of electric flux $B_G$.

Figure 3:
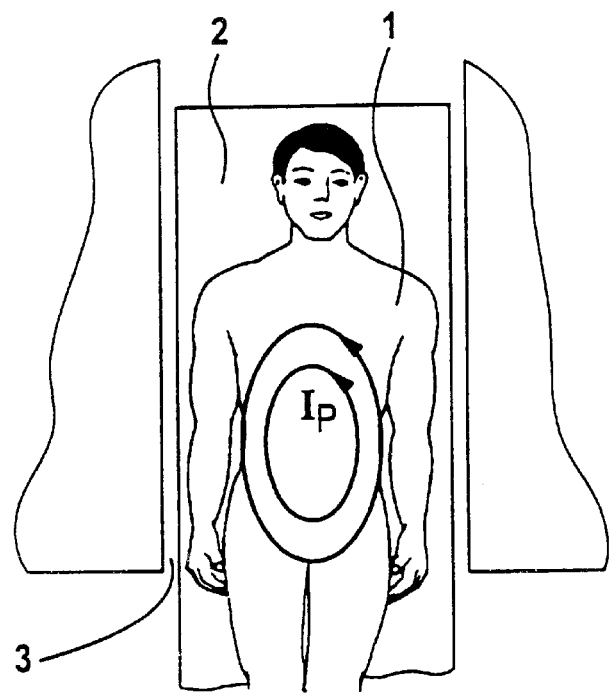
FIG. 3 is a coronal section through a region from FIG. 1.

FIG. 3 shows a coronal section through the patient from FIG. 1 at the level of the kidney region. The currents IP, which are generated by means of the gradient field $B_G$ in the abdomen of the patient, are shown as an example.

Figure 4:
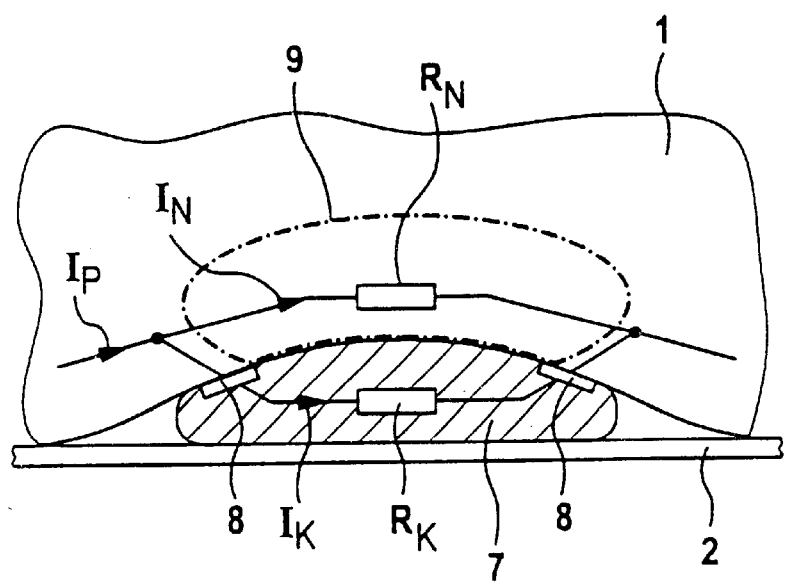
FIG. 4 is an enlargement of a region from FIG. 1.

FIG. 4 shows a section enlargement of the kidney region of the patient from FIG. 1. In addition, the kidney region 9 of the patient is identified, which is of less electrical conductivity vis-a-vis the surrounding tissue of the patient due to the human physiology. Further, an equivalent electrical circuit is additionally shown. The pillow 7 is composed of, for example, an electrically weakly conducting pillow case, which contains the electrode areas 8, and the case filling, which is a saline solution, for example. The pillow 7 effects a division of the current $I_p$, so that only a specific part of the current $I_p$ flows through the current path $R_N$ and the other part flows through the pillow 7 across the current path $R_K$. $R_N$ represents the electrical resistance of the area 9 and $R_K$ represents the electrical resistance of the pillow 7. Therefore, the resistance relation $R_N/R_K$ is the determining factor for dividing the current $I_P$ into the currents $I_N$ and $I_K$. $R_K$ is kept on the order of magnitude of the resistance of highly conductive body regions, i.e. of 1 S/m, for example. The current $I_N$ therefore becomes sufficiently small and the current $I_K$ becomes not so large that the patient can be injured in the electrode areas 8 due to current densities that are too high. The electrical voltages arising in the region 9 are reduced at least to values within the range of high conductivity, so that stimulations are prevented.

The current $I_P$ generated by means of the gradient field would completely flow through the region 9, i.e. $I_N$ would equal $I_P$, without the pillows being present. Due to the low electrical conductivity in the region 9, the current $I_P$ would cause comparatively high electrical voltages in the region 9, so that stimulations would occur in the region 9.

Although the present invention has been described with reference to a specific embodiment, those of skill in the art will recognize that changes may be made thereto without departing from the scope and spirit of the invention as set forth in the appended claims.

I claim as my invention:

1. A method for suppressing stimulations in a living subject undergoing a magnetic resonance scan comprising the steps of:

attaching at least two electrodes to the skin of a subject undergoing a magnetic resonance scan at a region of said subject exhibiting a lower electrical conductivity than surrounding regions of said subject; and electrically connecting said at least two electrodes to each other-to bridge said region exhibiting a lower electrical conductivity.

2. A method as claimed in claim 1 wherein said subject is undergoing said magnetic resonance scan in an imaging volume of a magnetic resonance apparatus, and comprising the additional step of connecting said at least two electrodes to said region of lower electrical conductivity outside of said imaging volume.

3. A method as claimed in claim 1 comprising attaching said at least two electrodes to the skin of the subject with a transition resistance substantially equal to zero between each electrode and the skin.

4. A method as claimed in claim 3 comprising applying electrically conductive flowable material between each of said at least two electrodes and the skin.

5. A method as claimed in claim 1 wherein said subject as highly conductive regions exhibiting a high electrical conductivity, and wherein the step of electrically connecting said at least two electrodes comprises electrically connecting said at least two electrodes with an electrical connection having an electrical conductivity substantially comparable to the electrical conductivity of said highly conductive regions.

6. A method as claimed in claim 1 wherein the step of electrically connecting said at least two electrodes to each other comprises electrically connecting said at least two electrodes to each other with an electrically conductive connection having an electrical conductivity in a range between 0.2 S/m through 4 S/m.

7. A device for suppressing stimulations in a living subject undergoing a magnetic resonance scan in a magnetic resonance tomography apparatus, said device comprising:

at least two electrode areas adapted for contacting the skin of an examination subject containing a highly electrically conductive region, undergoing a magnetic resonance scan, and at least one electrically conductive connection between said two electrode areas having a conductivity substantially corresponding to said highly electrically conductive region.

8. A device as claimed in claim 7 wherein said electrically conductive connection has an electrical conductivity in a range between 0.2 S/m through 4 S/m.

9. A device as claimed in claim 7 wherein at least said electrically conductive connection is physically flexible for adapting to attachment at differently shaped regions of an examination subject.

10. A device as claimed in claim 7 comprising a pillow having an exterior pillow surface at which said electrode areas are accessible, and wherein said electrically conductive connection proceeds through an interior of said pillow between said electrode areas.

11. A device as claimed in claim 10 comprising a gel-like mass contained in the interior said pillow.

12. A device as claimed in claim 11 wherein said pillow comprises an electrically conductive pillow case containing an electrically conductive pillow filling.

13. A device as claimed in claim 12 wherein said pillow filling comprises a saline solution.

* * * * *